United States Patent [19]

Okamura et al.

[11] Patent Number: 5,894,319
[45] Date of Patent: Apr. 13, 1999

[54] EXPOSURE DRUM FOR A NEWSPAPER PRINT-PLATE MAKING APPARATUS

[75] Inventors: Yuichi Okamura; Takemi Watanabe, both of Toyonaka, Japan

[73] Assignee: Kabushiki Kaisha Kaneda Kikai Seisakusho, Osaka-fu, Japan

[21] Appl. No.: 08/967,030

[22] Filed: Nov. 10, 1997

[51] Int. Cl.$^6$ .................................................. B41F 27/06
[52] U.S. Cl. ...................... 347/264; 347/262; 346/138; 101/389.1
[58] Field of Search .................... 347/264; 346/138; 101/389.1, 415.1; 355/73, 76

[56] References Cited

U.S. PATENT DOCUMENTS 5,400,118  3/1995  Simon ........................................ 355/76

*Primary Examiner*—N. Le
*Assistant Examiner*—Hai C. Pham
*Attorney, Agent, or Firm*—Griffin, Butler Whisenhunt & Szipl

[57] ABSTRACT

An exposure drum (11) of a CTP newspaper plate-making apparatus has a width (W) which is slightly greater than a vertical measurement ($L_1$) of one page of a newspaper, a circumference (L) which is slightly greater than a vertical measurement ($L_2$) of two pages of newspaper, first and second plate-material engaging pins (13a, 13b) spaced from each other on the cylindrical surface of the exposure drum a distance ($L_5$) which is equal to ½ of the circumference (L), second plate-material suction apertures (14a) in the cylindrical surface spaced from the first plate-material engaging pins a distance ($L_7$) which is slightly smaller than a horizontal measurement ($L_4$) of two pages of newspaper, first plate-material suction apertures (14a) in the cylindrical surface spaced from the first plate-material engaging pins a distance ($L_6$) which is slightly smaller than the vertical measurement ($L_1$) of one page of newspaper, and third plate-material suction apertures (14c) in the cylindrical surface spaced from the first plate-material engaging pins a distance ($L_8$) which is slightly smaller than the vertical measurement ($L_2$) of two pages of newspaper.

6 Claims, 12 Drawing Sheets

5,894,319

1

EXPOSURE DRUM FOR A NEWSPAPER PRINT-PLATE MAKING APPARATUS

BACKGROUND OF THE INVENTION

The invention relates to exposure drums for use in computerized, laser-direct-draw apparatus for making printing plates for newspaper printing, and more particularly to exposure drums used for making plates for printing newspapers in collect-run systems.

FIG. 7 illustrates a conventional newspaper rotary printing press in which webs of paper 2, fed from supply units S, are printed on both sides in three printing units 1, transferred in overlapped relationship, i.e. one over the other, into a folding unit T where the webs are cut and folded, and discharged as newspapers via a delivery fun U to a transfer apparatus (not shown). Also shown in FIG. 7 are printing cylinders 4 and blanket cylinders 5.

When the printing press shown in FIG. 7 is used in, for example, a single-imposition mode, a pair of printing plates $H_1$ and $H_2$ having four printing faces A, B, V, and X for four pages of a newspaper (see FIG. 12), and four printing faces C, D, Y, and Z (for four pages) respectively are mounted on the printing cylinder 4 of each printing unit 1 as shown in FIG. 8. Accordingly, each printing unit 1 can print 16 pages (eight pages on either side of a sheet). That is, 48 pages of a newspaper (16 pages×3 units) can be printed by the printing press shown in FIG. 7.

Similarly, when the printing press shown in FIG. 7 is used in a double-imposition mode, a pair of printing plates $H_3$ and $H_4$ having four printing faces A, B, A, and B for four pages of newspaper, (see FIG. 13), and four printing faces C, D, C and D (for four pages) respectively are mounted on the printing cylinder 4 of each printing unit 1, as shown in FIG. 9. Accordingly, each printing unit 1 can print 8 pages (four pages on either side of a sheet). Totally, 24 pages (8 pages×3 units) can be printed by the printing press. The number of the printing units 1 employed may depend on the number of pages of a finished newspaper.

The printing plates $H_1$, $H_2$, $H_3$ and $H_4$ to be mounted on the printing cylinders 4 are produced by a known computer-to-plate (CTP) method which includes the steps of mounting a photosensitive printing-plate material F (which may be an OPC sheet having an organic photoconductive layer deposited on an aluminum substrate or a PS sheet having a photosensitive coating applied on a thin base plate) on a cylindrical surface of an exposure drum E, rotating the exposure drum E while laterally moving a laser scanning head (an optical carriage) I, and drawing an image J directly on the photosensitive printing-plate material F by controlling the laser beam with an image signal from a computer G, as shown in FIG. 10. Referring to FIG. 10, there are provided a motor $M_2$ for driving the optical carriage I in a direction denoted by an arrow, a laser-beam source 6, a multi-beam generation element 7, an acoustic optical modulator 8, an exposure device 9, and a lens 10, the arrangement of which is a known, so-called, multi-beam optical system (see Japanese Patent Application No. 8-293494).

The exposure drum E has a width W' of about 790 mm (equal to the total of a horizontal measurement $L_4$ of two pages of a newspaper+$\alpha_4$=about 690 mm+100 mm) and a circumference length L' of about 1250 mm (equal to the total of a vertical measurement $L_2$ of two pages of the newspaper+$\alpha$=about 1160 mm+90 mm), as shown in FIGS. 11, 12 and 13. The exposure drum E is used to produce the four-face plates $H_1$ and $H_3$ (shown in each of FIGS. 12 and 13), four-face plates $H_2$ and $H_4$, full-spread type four-face

2 plates $H_{1a}$ and $H_{3a}$ (shown in FIGS. 14 and 15 respectively), paired-vertical two-face plates $H_{1b}$ and $H_{3b}$ (shown in FIGS. 16 and 17 respectively), and single-vertical two-face plates $H_{1c}$ and $H_{3c}$ (shown in FIGS. 18 and 19 respectively).

Also illustrated in FIG. 11 are several (three or four) engaging pins 13' for holding the plate material F. Furthermore, ten to fifteen suction apertures 14' are provided in the exposure drum E for holding an end of the plate material F by suction.

It is noted that one page of an ordinary daily newspaper has a horizontal measurement $L_3$ (FIGS. 16–19) of about 345 mm (about 13.5 inches) and a vertical measurement $L_1$ of about 580 mm (about 22.8 inches).

In recent years, as advertisements on newspapers are diversified and newspaper article contents are varied from district to district, a variety of methods of printing newspapers have been correspondingly developed. One of these methods is a collect-run method illustrated in FIG. 20 in which a sheet P (having 4 pages including pages A and B) and another sheet Q (having 4 pages including pages V and X) are overlapped onto one another and folded in two. Many other sheets also folded in two are inserted into the folded sheets such that central fold lines of all the sheets folded in two are arranged laterally. Then, all the sheets are finally folded together again into a quatro form.

It is common in the collect-run method to replace one page of article contents (or page contents) with another. For this replacement, a whole four-face plate $H_1$, $H_2$ or $H_3$, $H_4$ on the plate cylinder 4 has been exchanged with a new one.

Even if only one page, for example, of V or A face, has needed to be replaced, the whole four-face plate $H_1$ or $H_3$ (FIGS. 12 or 13) has been replaced. A replacement of the bulky four-face plate $H_1$ or $H_3$ is not only time-consuming, but is also costly and uneconomical because a plate is wasted.

The same drawback exists when replacing the paired-vertical two-face plates $H_{1b}$ or $H_{3b}$ shown in FIGS. 16 or 17, and the single-vertical two-face plate $H_{1c}$ or $H_{3c}$ shown in FIGS. 18 or 19. Replacement of a whole two-face plate because of a necessity to replace only one page is also uneconomical.

It is an object of this invention to provide a novel exposure drum for an apparatus for making printing plates for newspaper printing capable of making such newspaper printing plates at high efficiency using the CTP method wherein any page of a newspaper is easily replaced with another desired page, with a loss of plate materials which results from such replacement when using four-face plates $H_1$, $H_2$, $H_3$ and $H_4$, and paired-vertical two-face plates $H_{1b}$ or $H_{2b}$ (not shown), $H_{3b}$ and $H_{4b}$ (not shown), being minimized.

SUMMARY OF THE INVENTION

According to principles of this invention, an exposure drum, for use in a CTP apparatus for printing plates for newspaper printing in which an image is directly drawn with a laser beam on a photosensitive printing-plate material wrapped around the exposure drum, has a width W which is slightly greater than a vertical measurement $L_1$ of one page of newspaper, a circumference L which is slightly greater than a vertical measurement $L_2$ of two pages of the newspaper, first plate-material engaging pins 13a and second plate-material engaging pins 13b spaced from each other on a cylindrical surface of the exposure drum by a distance $L_5$ which is equal to ½ of the circumference L, second plate-material suction apertures 14b in the cylindrical surface spaced from the first plate-material engaging pins 13a about the cylindrical surface a distance $L_7$ which is slightly smaller than a horizontal measurement $L_4$ of two pages of the newspaper, first plate-material suction apertures 14a in the cylindrical surface spaced from the first plate-material engaging pins 13a a distance $L_6$ which is slightly smaller than a vertical measurement $L_1$ of one page of the newspaper, and third plate-material suction apertures 14c in the cylindrical surface spaced from the first plate-material engaging pins 13a a distance $L_8$ which is slightly smaller than a vertical measurement $L_2$ of two pages of the newspaper.

In one embodiment, the width W of the exposure drum may be set at a value which is smaller than, or equal to, a total of the vertical measurement $L_1$ of one page of the newspaper plus 50 mm and the circumference L of the exposure drum may be set at a value which is smaller than, or equal to, a total of the vertical measurement $L_2$ of two pages of the newspaper plus 90 mm.

The circumferential distance $L_6$ between the first plate-material engaging pins 13a and the first plate-material suction apertures 14a may be set at a value which is at least 20 mm smaller than the vertical measurement $L_1$ of one page of the newspaper, the circumferential distance $L_8$ between the first plate-material engaging pins 13a and the third plate-material suction apertures 14c may be set at a value which is at least 20 mm smaller than the vertical measurement $L_2$ of the two pages of the newspaper, and the circumferential distance $L_7$ between the first plate-material engaging pins 13a and the second plate-material suction apertures 14b may be set at a value which is at least 20 mm smaller than the horizontal measurement $L_4$ of two pages of the newspaper.

BRIEF DESCRIPTION OF THE DRAWINGS

The invention is described and explained in more detail below using the embodiments shown in the drawings. The described and drawn features, in other embodiments of the invention, can be used individually or in preferred combinations. The foregoing and other objects, features and advantages of the invention will be apparent from the following more particular description of a preferred embodiment of the invention, as illustrated in the accompanying drawings in which reference characters refer to the same parts throughout the different views. The drawings are not necessarily to scale, emphasis instead being placed upon illustrating principles of the invention in a clear manner.

DESCRIPTION OF THE PREFERRED EMBODIMENT

One embodiment of the present invention will be described referring to the accompanying drawings.

Figure 1:
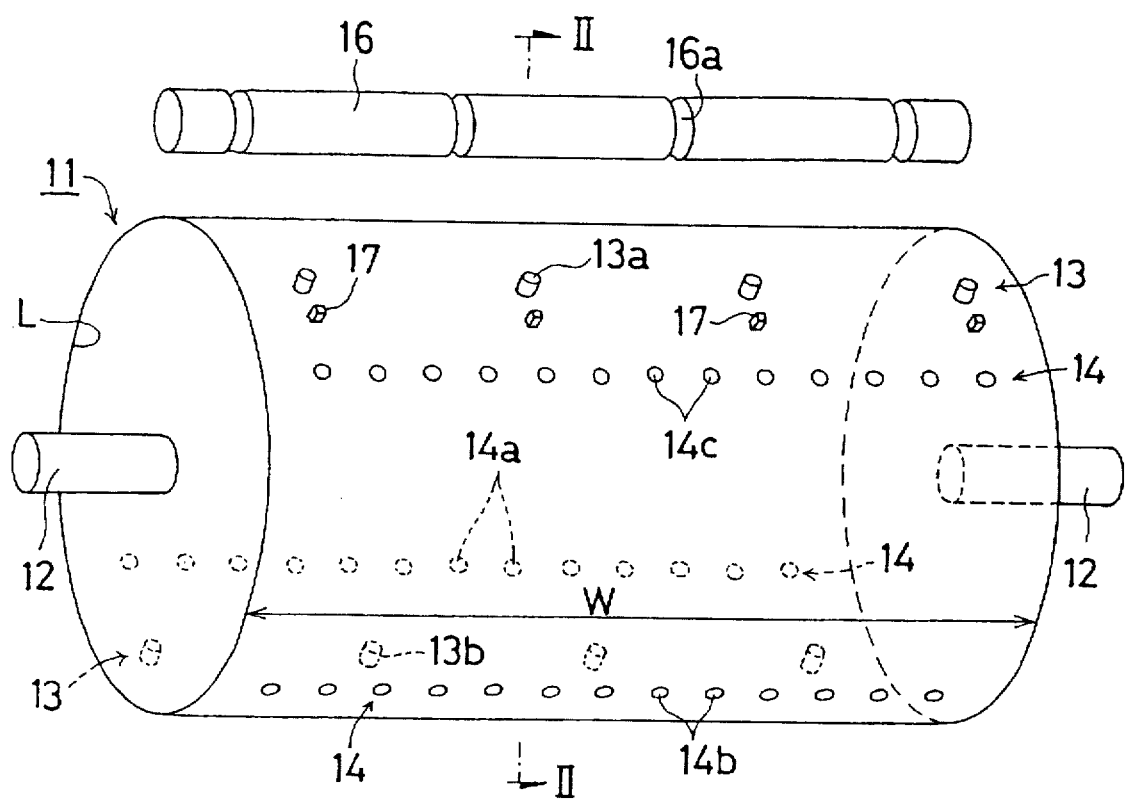
FIG. 1 is a schematic perspective view of an exposure drum according to principles of the present invention.
Figure 2:
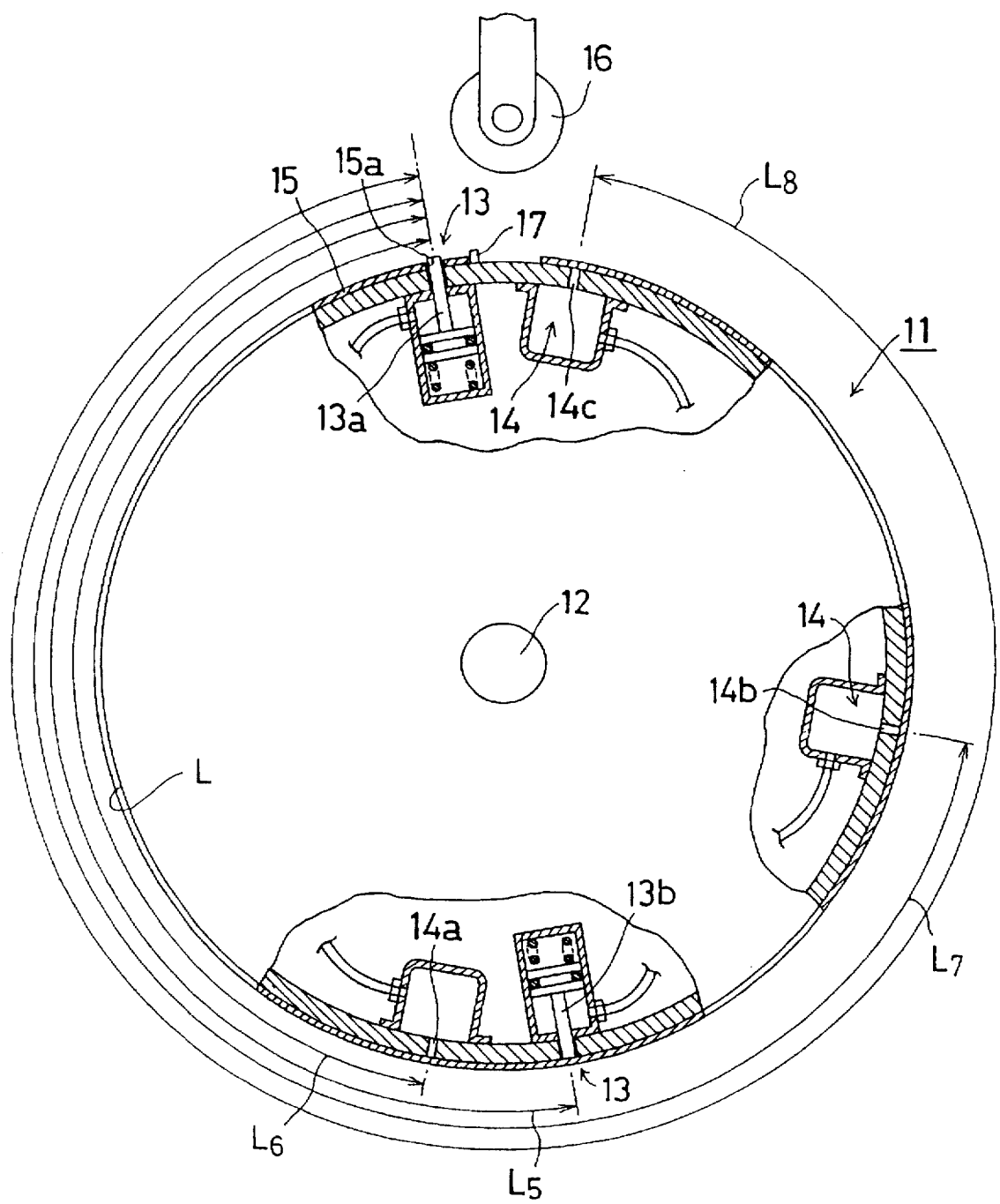
FIG. 2 is an enlarged cross sectional view taken on line II—II in FIG. 1.

FIG. 1 is a schematic perspective view of an exposure drum 11 according to the present invention. FIG. 2 is an enlarged cross sectional view taken on line II—II of FIG. 1.

Figure 11:
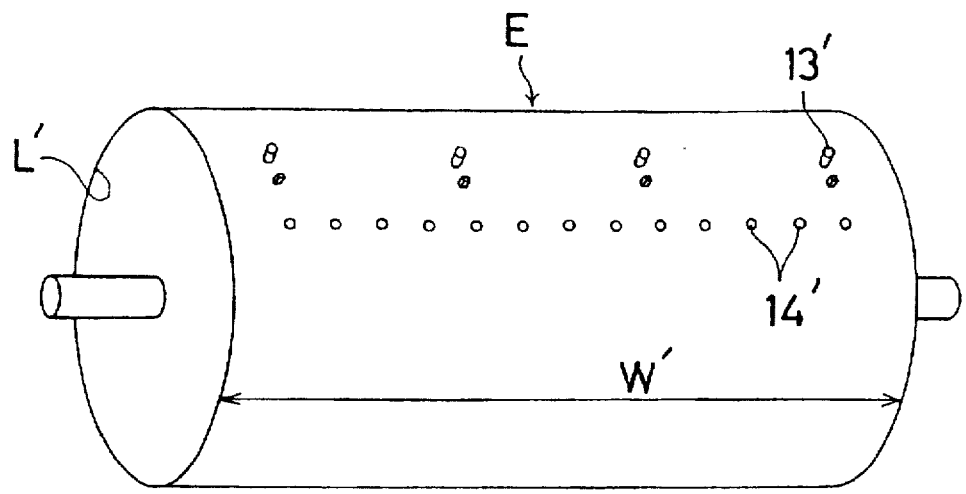
FIG. 11 is a schematic perspective view of an exposure drum in the CTP plate-making apparatus.
Figure 16:
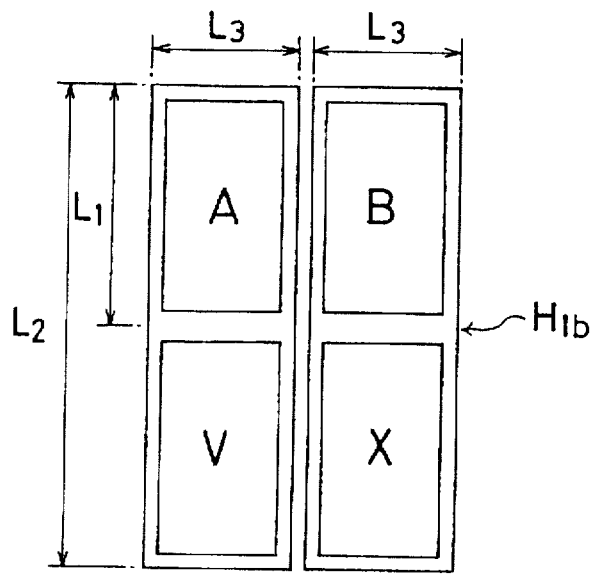
FIG. 16 is a plan view showing a pair of vertical two-face printing plates.
Figure 17:
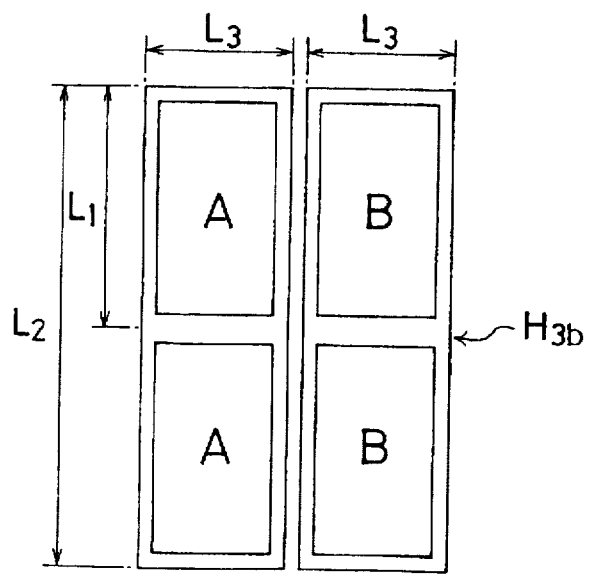
FIG. 17 is a plan view showing another pair of vertical two-face printing plates.
Figure 18:
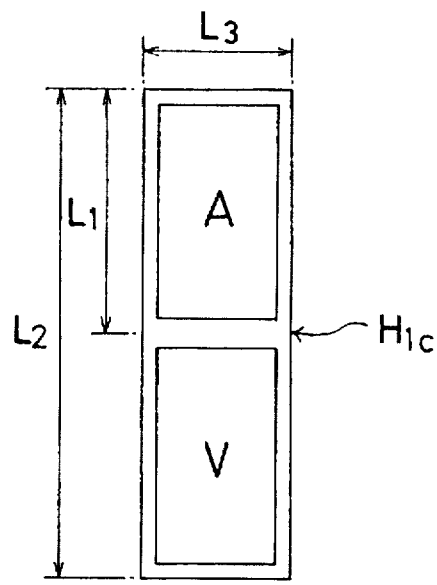
FIG. 18 is a plan view showing a single vertical two-face printing plate.
Figure 19:
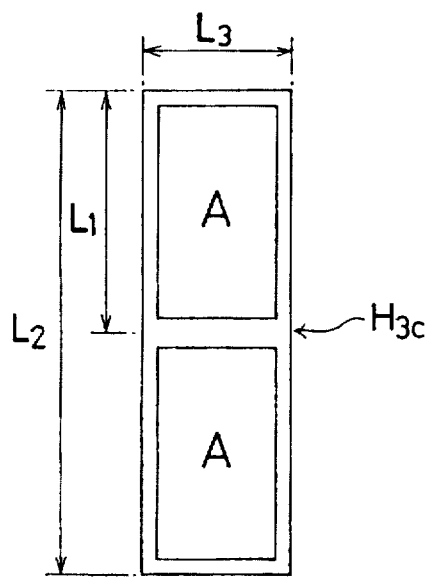
FIG. 19 is an explanatory view showing another single vertical two-face printing plate.
Figure 20:
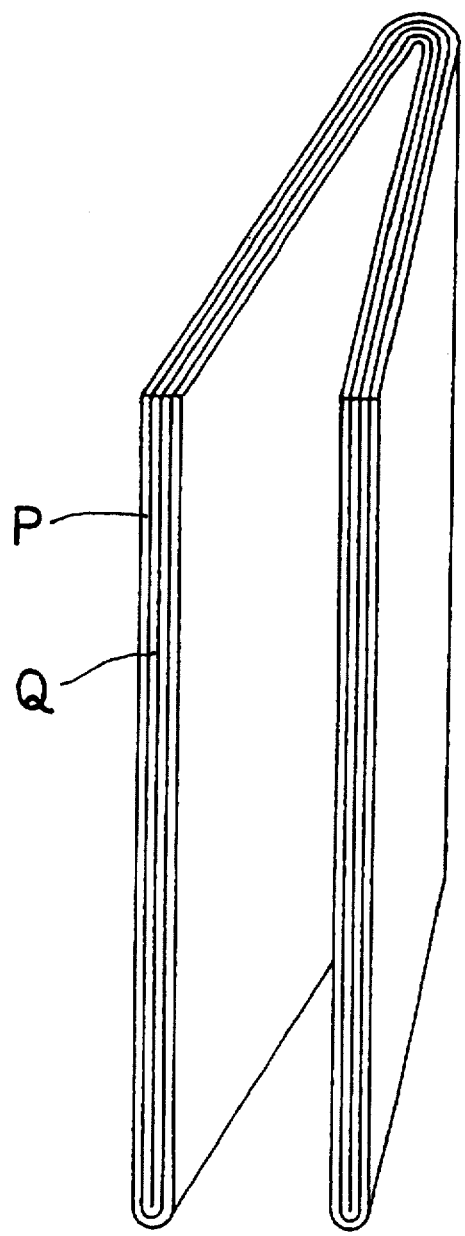
FIG. 20 is an isometric view showing a folded newspaper printed with collect-run printing method.

The exposure drum 11 of the present invention has a diameter such that a circumference L is about 1250 mm (equal to the total of a vertical measurement $L_2$ of two pages of newspaper+$\alpha_5$=1160 mm+90 mm). More specifically, the circumference L of the exposure drum 11 is identical to the circumference L' of the conventional exposure drum E shown in FIG. 11 for making the paired, vertical two-face plates $H_{1b}$ and $H_{3b}$ shown in FIGS. 16 and 17 and the single, vertical two-face plates $H_{1c}$ and $H_{3c}$ shown in FIGS. 18 and 19.

The exposure drum 11 has a pair of support shafts 12 provided outwardly on both ends thereof so that it can be rotatably supported by the two support shafts 12.

Two rows of plate-material engaging pins 13 are mounted at a cylindrical surface of the exposure drum 11 and are spaced from each other by a distance $L_5$ of (about 625 mm) which is ½ of the circumference L as will be explained later. Accordingly, an upper end of photosensitive printing-plate material 15, which is approximately 0.3 mm thick, can be closely attached to the cylindrical surface of the exposure drum 11 with engaging apertures 15a at the upper end being engaged by the engaging pins 13, as shown in FIG. 2.

Also, stops 17 are provided on the cylindrical surface for positioning the upper end(s) of the plate material 15. While the stops 17 which are located close to first plate-material engaging pins 13a are fixed as shown in FIG. 1 or 2, stops 17 located close to second plate-material engaging pins 13b are retractable, although not illustrated.

The exposure drum 11 has three rows of plate-material suction apertures 14 provided in a cylindrical-surface member thereof, adjacent rows being spaced given distances from one another about the circumference L, as described below. The plate material 15, held at its upper end by the engaging pins 13, can be secured to the cylindrical surface of the exposure drum 11 at its lower end by a vacuum suction of the suction apertures.

Referring to FIGS. 1 and 2, a plate-material hold-down roll 16 is disposed above and parallel to the exposure drum 11 for moving upwardly and downwardly. When plate material 15 has been loaded onto the exposure drum 11, the plate-material hold-down roll 16 is lowered to press the plate material 15 so as to closely attach it to the cylindrical surface of the exposure drum 11. The plate-material hold-down roll 16 has grooves 16a therein for clearing the engaging pins 13 and the stops 17.

Basic structure of the exposure drum 11, as well as structures of the engaging pins 13, the suction apertures 14, and the plate-material hold-down roll 16, are the same as those of the conventional exposure drum E for the CTP method and will, therefore, not be explained here in detail.

The exposure drum 11 of the present invention has a width W of about 630 mm ($L_1+\alpha_0=580$ mm=50 mm) which is slightly greater than the vertical measurement $L_1$ (about 560 mm) of one page of a newspaper. Although the drum 11 makes a printing plate for printing a web of traditional newspaper size, the width W of the exposure drum 11 is smaller than the width W' (=about 790 mm) of the conventional exposure drum E (equal to the total of the horizontal measurement of two pages, 690 mm+100 mm).

The first engaging pins 13a and the second engaging pins 13 of the exposure drum 11 are spaced from each other by the distance $L_5=\frac{1}{2}$ (about 625 mm) (or by an angle of 180 degrees) so as to oppose each other, as shown in FIG. 2.

A row of the first suction apertures 14a is circumferentially distanced from the first engaging pins 13a by a distance $L_6$ of about 560 mm (=$L_1$ (the vertical measurement of one page)–$\alpha_2$=580 mm–20 mm), a row of the second suction apertures 14b is circumferentially distanced by a distance $L_7$ of about 670 mm (=$L_4$ (the horizontal measurement of two pages )–$\alpha_1$=690 mm–20 mm), and the row of the third suction apertures 14c are circumferentially distanced by a distance of $L_8$ of about 1140 mm (=$L_2$ (the vertical measurement of two pages)–$\alpha_3$=1160 mm–20 mm).

A procedure for making the printing plates $H_5$, $H_6$, $H_7$, and $H_8$ with the exposure drum 11 of the present invention will now be described.

Figure 3:
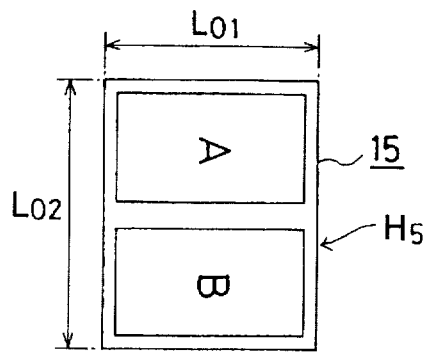
FIG. 3 is a plan view showing a two-face printing plate for two pages of a newspaper.

For making the two-face printing plate $H_5$, a photosensitive printing-plate material 15 having a horizontal measurement $L_{O1}$ of about 580 mm and a vertical measurement $L_{O2}$ of about 690 mm, as shown in FIG. 3, is secured to the cylindrical surface of the exposure drum 11 by the first plate-material engaging pins 13a and the second plate-material suction apertures 14b.

Figure 10:
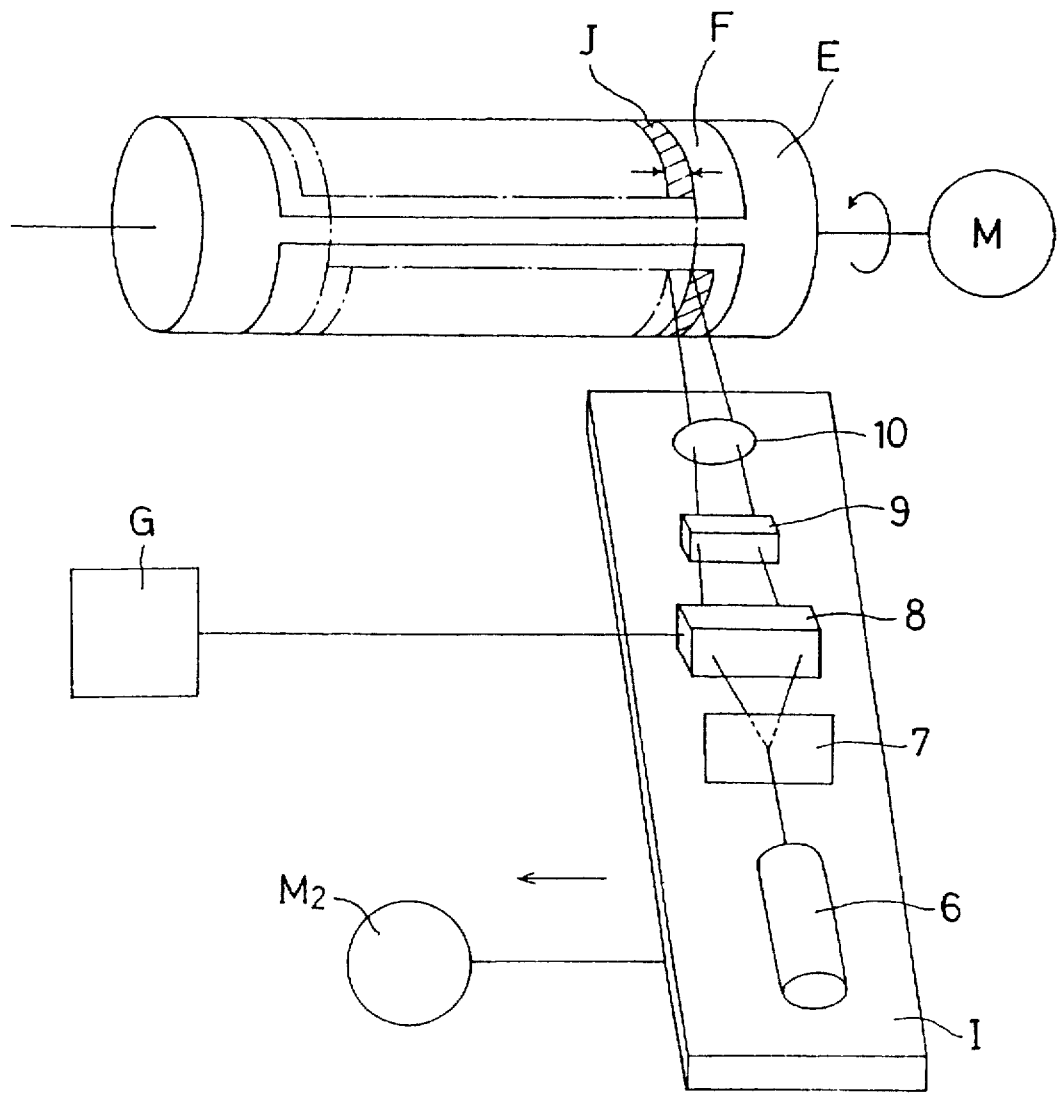
FIG. 10 is an isometric schematic view showing a CTP plate-making apparatus of a multi-beam type.

Then, an image is directly drawn on the photosensitive printing-plate material 15 as shown in FIG. 10, by a laser beam with the CTP method to produce a two-face printing plate $H_5$ shown in FIG. 3.

Contents of image-drawings on the two-face plate $H_5$ are not limited to A and B. It may be provided with any combination such as V and X, C and D, or Y and Z.

Figure 12:
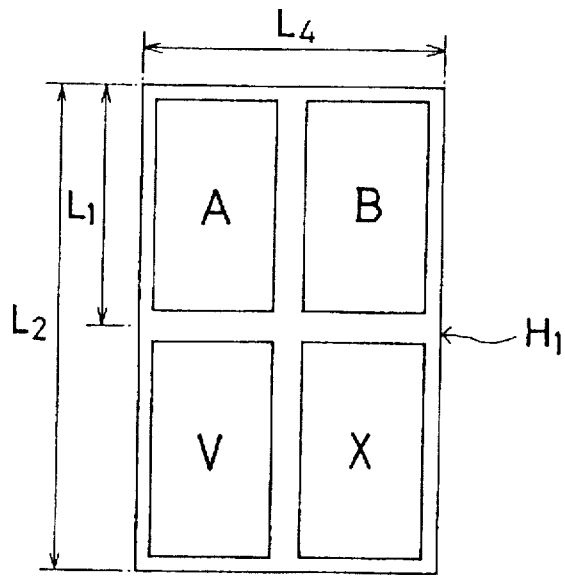
FIG. 12 is a plan view showing a four-face printing plate.
Figure 13:
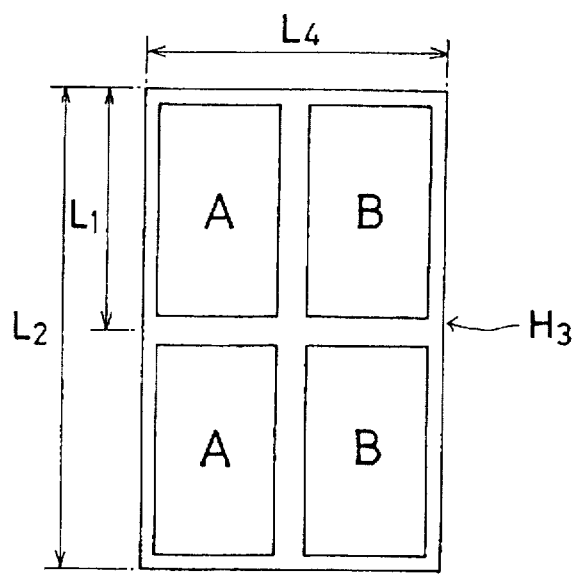
FIG. 13 is a plan view showing another four-face printing plate.

As is apparent, an arrangement of two of the two-face printing plates $H_5$ is equivalent to a 0 four-face printing plate $H_1$ or $H_3$ shown in FIG. 12 or 13.

Figure 4:
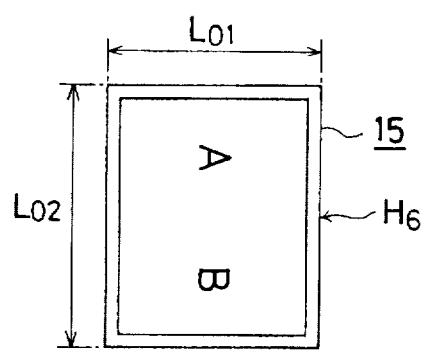
FIG. 4 is a plan view showing an undivided two-face printing plate.

For making an undivided two-face printing plate $H_6$, a photosensitive printing-plate material 15 having a horizontal measurement $L_{O1}$ of about 580 mm and a vertical measurement $L_{O2}$ of about 690 mm, as shown in FIG. 4, which is identical to the photosensitive printing-plate material 15 for the printing plate $H_5$, is secured to the exposure drum 11 by the first plate-material engaging pins 13a and the second plate-material suction apertures 14b.

Then, an image is directly drawn on the photosensitive printing-plate material 15 by the laser beam controlled with the CTP method to produce the undivided two-face printing plate $H_6$ shown in FIG. 4.

Figure 14:
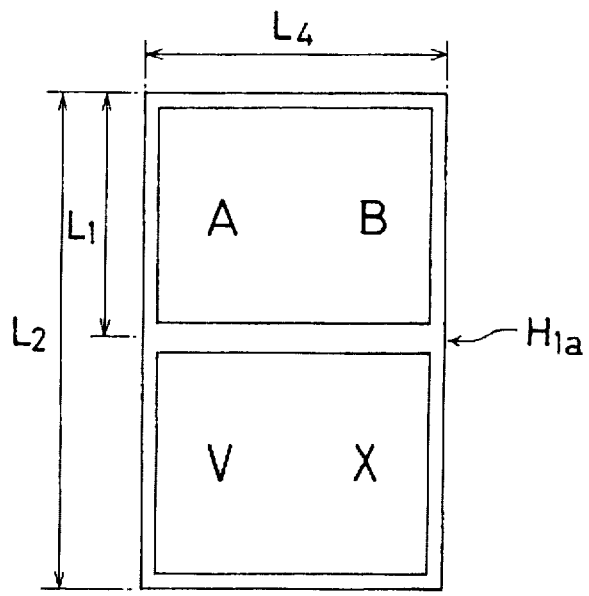
FIG. 14 is a plan view showing a full-spread type printing plate.
Figure 15:
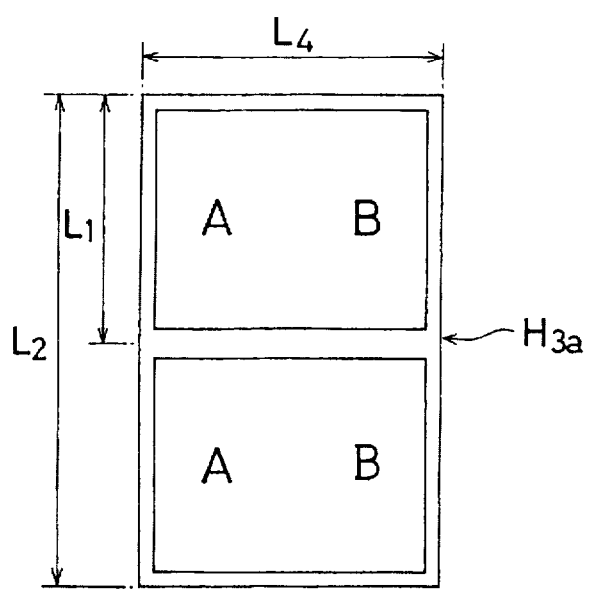
FIG. 15 is a plan view showing another full-spread type four-face printing plate.

The undivided two-face plate $H_6$ may carry a combination of V and X, C and D, or Y and Z. An arrangement of two of the undivided two-face plates $H_6$ is equivalent to making the full spread type four face printing plate $H_{1a}$ or $H_{3a}$ shown in FIG. 14 or 15.

Figure 5:
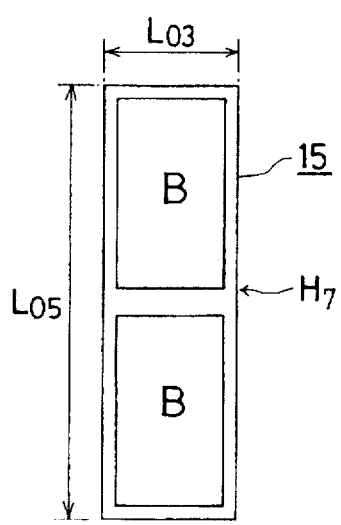
FIG. 5 is a plan view showing a single vertical two-face printing plate.

For making a single, vertical two-face printing plate $H_7$, a photosensitive printing-plate material 15 having a horizontal measurement $L_{O3}$ of about 345 mm and a vertical measurement $L_{O5}$ of about 1160 mm, as shown in FIG. 5, is secured to the exposure drum 11 by the first plate-material engaging pins 13a and the third plate-material suction apertures 14c.

Then, an image is directly drawn on the photosensitive printing-plate material 15 by the laser beam controlled with the CTP method to produce the single, vertical two-page plate $H_7$ shown in FIG. 5. Similarly, the printing plate $H_7$ may carry a combination of A and A, V and X, A and V, or B and X.

Figure 6:
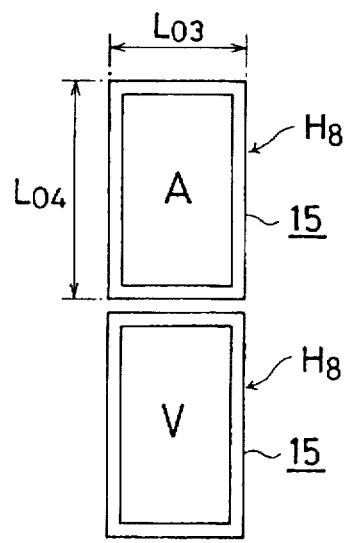
FIG. 6 is a plan view showing two separate one-face printing plates.
Figure 8:
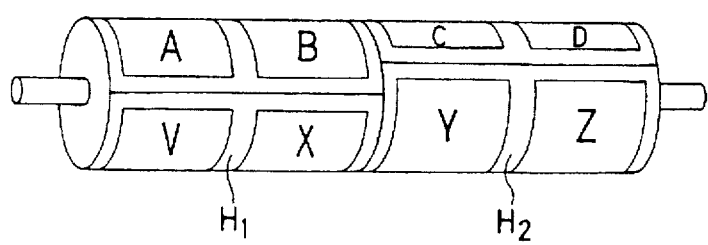
FIG. 8 is a schematic isometric view of a conventional plate cylinder loaded with printing plates (of single imposition)
Figure 9:
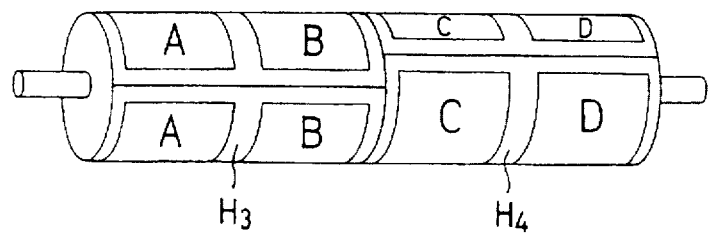
FIG. 9 is a schematic isometric view of a conventional plate cylinder loaded with printing plates (of double imposition)
Figure 7:
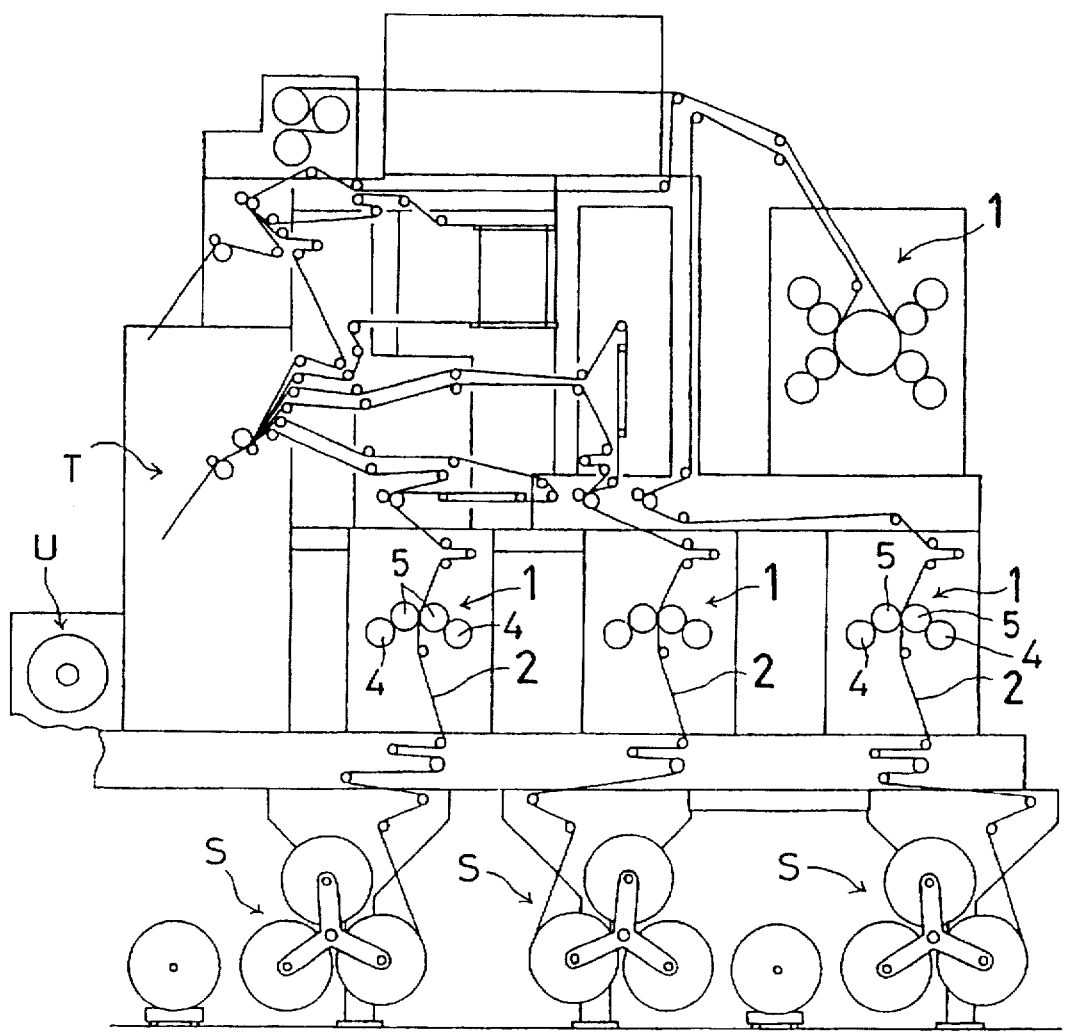
FIG. 7 is a schematic view illustrating a conventional newspaper printing rotary press.

Furthermore, a pair of plate materials 15 having a horizontal measurement $L_{O3}$ of about 345 mm and a vertical measurement $L_O$ of about 580 mm are used for making a separate one-face printing plates $H_8$ as shown in FIG. 6. One of the plate materials 15 is secured to the cylindrical surface of the exposure drum 11 by the first plate-material engaging pins 13a and the first plate-material suction apertures 14a, and the other by the second plate-material engaging pins 13b and the third plate-material suction apertures 14c.

Then, images are directly drawn onto the plate materials 15 at one time by the laser beam controlled by the CTP method to produce two separate one-face plates $H_8$, each corresponding to a page of a newspaper, as shown in FIG. 6.

EFFECT OF THE INVENTION

As set forth above, the exposure drum 11 of the present invention is characterized in that the first plate-material engaging pins 13a and the second plate-material engaging pins 13b are spaced from each other on the cylindrical surface of the exposure drum by the distance $L_5$ which is equal to $\frac{1}{2}$ of the circumference L of the exposure drum, the second plate-material suction apertures 14b are spaced from the first plate-material engaging pins 13a on the drum cylindrical surface by the distance $L_7=L_4-\alpha_1$ which is slightly smaller than the horizontal measurement $L_4$ of two pages of a newspaper, the first plate-material suction apertures 14a are spaced from the first plate-material engaging pins 13a on the drum cylindrical surface by the distance $L_6=L_1-\alpha_2$ which is slightly smaller than the vertical measurement $L_1$ of one page of the newspaper, and the third plate-material suction apertures 14c are spaced from the first plate-material engaging pins 13a on the drum cylindrical surface by the distance $L_8=L_2-\alpha_3$ which is slightly smaller the vertical measurement $L_2$ of two pages of the newspaper.

Accordingly, the exposure drum 11 can produce a two-face plate $H_5$, an undivided two-face plate $H_6$, a single vertical two-face plate $H_7$, and separate one-face plates $H_8$ separately. The area of the plate materials used by the present drum is almost $\frac{1}{2}$ of those used by the conventional exposure drum E which has a width W' (equal to about 790 mm=$L_4$ (the horizontal measurement of two pages of a newspaper)+$\alpha_4$) and a length of circumference L'(equal to about 1250 mm=$L_2$ (the vertical measurement of two pages)+$\alpha_5$) for making the conventional four-face plate.

full-spread type four-face plate, and the paired-vertical two-face plates ($H_1$, $H_{1a}$ and $H_{1b}$, respectively), although a production time is substantially two times greater in the present invention.This makes it unnecessary to replace a printing plate of a large size when one particular page has to be replaced with a desired one in the collect-run method of newspaper printing. When the separate one-face plate $H_8$ is, for example, used, replacement of the printing plate corresponding to the page of newspaper is sufficient.Using an exposure drum of the present invention, a printing plate to be replaced is reduced to substantially ½ the size, of that of a conventional printing plate, and an economical loss due to such replacement can be halved while troubles caused by the replacement are reduced. As a result, even when article contents in newspapers are often partially changed, newspaper printing can be carried out with less cost than in the conventional art.While the invention has been particularly shown and described with reference to a preferred embodiment, it will be understood by those of ordinary skill in the art that various changes in form and detail may be made therein without departing from the spirit and scope of the invention.

DESCRPTION OF NUMERALS AND SIGNS11. exposure drum, 12. support shafts, 13. plate-material engaging pins, 13a. first plate-material engaging pins, 13b. second plate-material engaging pins, 14. plate-material suction apertures, 14a. first plate-material suction apertures, 14b. second plate-material suction apertures, 14c. third plate-material suction apertures, 15. plate material, 15a. engaging apertures, 16. plate-material hold-down roll, W. the drum width, substantially 630 mm (equal to $L_1$ (the vertical measurement of one page of a newspaper)+ $α_0$), L. the length of circumference of the drum, (substantially 1250 mm (equal to $L_2$. the vertical measurement of two pages of the newspaper)+$α_5$), $L_1$. the vertical measurement of one page of newspaper (about 580 mm), $L_2$. the vertical measurement of two pages of newspaper (about 1160 mm), $L_3$. the horizontal measurement of one page of the newspaper (about 345 mm), $L_4$. the horizontal measurement of two pages of the newspaper (about 690 mm), $L_5$. the distance between the first plate-material engaging pins 13a and the second plate-material engaging pins 13b (about 625 mm), $L_6$. the distance between the first plate-material engaging pins 13a and the first plate-material suction apertures 14a (about 560 mm), $L_7$. the distance between the first plate-material engaging pins 13a and the second plate-material suction apertures 14b (about 670 mm), $L_8$. the distance between the first plate-material engaging pins 13a and the third plate-material suction apertures 14c (about 1140 mm), $L_{O1}$. the horizontal measurement of a printing material, $L_{O2}$. the vertical measurement of the printing material, $L_{O3}$. the horizontal measurement of another printing material (about 345 mm), $L_{O4}$. the vertical measurement of another printing material (about 580 mm), $L_{O5}$. the vertical measurement of a further printing material (about 1160 mm), $H_5$. two-page printing plate, $H_6$. full open two-page printing plate, $H_7$. vertical two-page printing plate, $H_8$ separate one-page printing plate.

The invention claimed is: 1. An exposure drum for use in a CTP type apparatus for making printing plates for newspaper printing using a process in which an image is drawn by a laser beam directly on a photosensitive printing-plate material wrapped around a cylindrical surface of the exposure drum wherein: a width (W) of the exposure drum is slightly greater than a vertical measurement ($L_1$) of one page of newspaper; a circumference (L) of the cylindrical surface of the exposure drum is slightly greater than a vertical measurement ($L_2$) of two pages of newspaper; first plate-material engaging pins (13a) and second plate-material engaging pins (13b) on the cylindrical surface of the exposure drum are spaced from each other by a circumferential distance ($L_5$) which is equal to ½ the circumference (L); second plate-material suction apertures (14b) in the drum cylindrical surface are spaced from the first plate-material engaging pins (13a) by a circumferential distance ($L_7$) which is slightly smaller than a horizontal measurement ($L_4$) of two pages of newspaper; first plate-material suction apertures (14a) in the cylindrical surface are spaced from the first plate-material engaging pins (13a) a circumferential distance ($L_6$) which is slightly smaller than the vertical measurement ($L_1$) of one page of the newspaper; and third plate-material suction apertures (14c) in the drum cylindrical surface are spaced from the first plate-material engaging pins (13a) a circumferential distance ($L_8$) which is slightly smaller than the vertical measurement ($L_2$) of two pages of the newspaper. 2. The exposure drum as in claim 1, wherein the width (W) of the exposure drum is smaller than a total of the vertical measurement ($L_1$) of one page of newspaper and 50 mm, and the circumference (L) of the cylindrical surface of the exposure drum is smaller than a total of the vertical measurement ($L_2$) of two pages of newspaper and 90 mm.3. The exposure drum as in claim 2, wherein the circumferential distance ($L_6$) between the first plate-material engaging pins (13a) and the first plate-material suction apertures (14a) is at least 20 mm smaller than the vertical measurement ($L_1$) of one page of newspaper, the circumferential distance ($L_8$) between the first plate-material engaging pins (13a) and the third plate-material suction apertures (14c) is at least 20 mm smaller than the vertical measurement ($L_2$) of two pages of the newspaper, and the circumferential distance ($L_7$) between the first plate-material engaging pins (13a) and the second plate-material suction apertures (14b) is at least 20 mm smaller than the horizontal measurement ($L_4$) of two pages of newspaper. 4. The exposure drum as in claim 1, wherein the circumferential distance ($L_6$) between the first plate-material engaging pins (13a) and the first plate-material suction apertures (14a) is at least 20 mm smaller than the vertical measurement ($L_1$) of one page of newspaper, the circumferential distance ($L_8$) between the first plate-material engaging pins (13a) and the third plate-material suction apertures (14c) is at least 20 mm smaller than the vertical measurement ($L_2$) of two pages of the newspaper, and the circumferential distance ($L_7$) between the first plate-material engaging pins (13a) and the second plate-material suction apertures (14b) is at least 20 mm smaller than the horizontal measurement ($L_4$) of two pages of newspaper.5. A CTP apparatus comprising an exposure drum as in claim 1, wherein said exposure drum further includes stops on the cylindrical surface near the first plate-material engaging pins for engaging an end of the plate material and wherein is further included a plate-material hold down roll disposed adjacent the roll for moving toward and away from the roll for pressing portions of said plate material against the cylindrical surface.6. The CTP apparatus as in claim 5, wherein the width (W) of the exposure drum is smaller than a total of the vertical measurement ($L_1$) of one page of newspaper and 50 mm, and the circumference (L) of the cylindrical surface of the exposure drum is smaller than a total of the vertical measurement ($L_2$) of two pages of newspaper and 90 mm.

* * * * *